United States Patent [19]
Harris et al.

[11] Patent Number: 5,850,153
[45] Date of Patent: Dec. 15, 1998

[54] TRISTATABLE OUTPUT DRIVER FOR USE WITH 3.3 OR 5 VOLT CMOS LOGIC

[75] Inventors: Colin Harris, New Westminister; Curtis B. Lapadat, Burnaby, both of Canada

[73] Assignee: PMC-Sierra Ltd., Burnaby, Canada

[21] Appl. No.: 861,575

[22] Filed: May 22, 1997

Related U.S. Application Data

[63] Continuation of Ser. No. 536,267, Sep. 29, 1995.

[51] Int. Cl.$^6$ ........................ H03K 19/00; H03K 19/0185
[52] U.S. Cl. .................................. 326/58; 326/81; 326/83
[58] Field of Search ................................. 326/56–58, 17, 326/83, 86, 81

[56] References Cited

U.S. PATENT DOCUMENTS

| | | | |
|---|---|---|---|
| 5,399,925 | 3/1995 | Nguyen | 326/58 |
| 5,418,476 | 5/1995 | Strauss | 326/58 |
| 5,440,249 | 8/1995 | Schucket et al. | 326/81 |
| 5,546,019 | 8/1996 | Liao | 326/81 |
| 5,587,671 | 12/1996 | Zagar et al. | 326/83 |
| 5,631,579 | 5/1997 | Miki et al. | 326/58 |
| 5,717,342 | 2/1998 | Lofti et al. | 326/17 |

*Primary Examiner*—Jon Santamauro
*Assistant Examiner*—Don Phu Le
*Attorney, Agent, or Firm*—Pascal & Associates

[57] ABSTRACT

A tri-state output driver comprised of a pair of complementary field effect transistors (CMOS FETs) having sources and drains connected in a series circuit between a voltage rail and ground, apparatus for applying similar logic high and low input signals to respective gates of the FETs whereby an output terminal connected in a circuit between the sources and drains of the FETs is driven toward ground or the voltage rail respectively, or opposite polarity input signals to the gates for causing the FETs to assume a high impedance, and apparatus for maintaining a voltage across the source and drain of the FET which is connected in a circuit between the voltage rail and the output terminal, at less than a lower of an FET threshold of conduction voltage or diode turn-on voltage greater than the voltage of the voltage rail, during the high impedance state, so as to maintain the latter FET in a high impedance state even when a voltage at the output terminal is equal to a voltage which is higher than an FET threshold of conduction or diode turn-on voltage greater than the voltage of the voltage rail.

2 Claims, 1 Drawing Sheet

TRISTATABLE OUTPUT DRIVER FOR USE WITH 3.3 OR 5 VOLT CMOS LOGIC

This is a continuation of application Ser. No. 08/536,267, filed Sep. 29, 1995 now abandoned.

FIELD OF THE INVENTION

This invention relates to the field of logic circuits, and in particular to a tri-state driver that can be realized using complementary metal oxide field effect transistors (CMOS FETs).

BACKGROUND TO THE INVENTION

As the state of the art of integrated circuits has advanced, designers have reduced the power supply voltage required to power the circuits, e.g. from 5.0+/−10% volts to 3.3+/−10% volts. However, some circuits which require the use of 5.0 volts, such as some transistor-transistor logic (TTL) circuits, are sometimes to be driven by 3.3 volt CMOS tri-state drivers. The voltage requirements are incompatible.

One result of this voltage incompatibility is that when a voltage significantly greater than the power supply rail voltage is applied, e.g. from the driven circuit to the output terminal of a lower voltage CMOS tri-state driver, the PMOS (p-channel) FET of the driver turns on when it is intended to be off. When using standard 5 volt driven circuit inputs with 3.3 volt driver outputs, the PMOS FET of the 3.3 volt driver which should be in a high impedance state begins to pass current when the voltage at its output is about 0.5 volts higher than the supply voltage (VDD) of 3.3 volts (i.e. less than 5.0 volts). It appears that this occurs because the source terminal of the PMOS FET becomes forward biased relative to its substrate, which is typically connected to VDD.

In order to overcome the incompatibility, special buffer chips are sometimes used to separate the 3.3 volt driver from the 5.0 volt TTL or FET logic circuits. Alternatively, a special 5 volt voltage pin is used with the 3.3 volt driver (which thus requires a 5.0 volt supply), or resistors are connected in series with the output terminal of the 3.3 volt driver, which reduces the amplitude of the output signal, wastes power, wastes chip space, increases cost, etc.

SUMMARY OF THE INVENTION

The present invention is a tri-state output driver that can be used with either of 3.3 volt or 5.0 volt logic, and can work with either voltage supply of 3.3 volts or 5.0 volts. It can drive logic high or low levels into 3.3 or 5.0 volt CMOS inputs, and can remain tristated, even when 0–5.5 volt signals are applied. It can also drive to high and low logic levels without requiring external pull-up resistors (i.e. it does not have an open drain output).

In accordance with an embodiment of the invention, a tri-state output driver is comprised of a first and second complementary field effect transistors (CMOS FETs) having sources and drains connected in series between a voltage rail and ground. The first FET is connected to the voltage rail and the second FET is connected to ground. Similar logic high and low input signals are applied to respective gates of the FETs whereby an output terminal coupled to the FETs is driven toward ground or the voltage rail respectively, or opposite polarity input signals are applied to the gates for causing said FETs to assume a high impedance. A maintaining circuit maintains a voltage at the source or drain of the first FET which is not connected to the voltage rail at less than a sum of a lower of an FET threshold of conduction voltage and a bipolar diode turn on voltage, and the voltage of the voltage rail, during the high impedance state, so as to maintain the first FET in a high impedance state even when a voltage at the output terminal is equal to the sum.

In accordance with another embodiment, a tri-state output driver is comprised of a voltage rail, an output terminal and a ground terminal. First and second FETs have source and drain terminals connected in series between the voltage rail and the output terminal, the first FET having its source substrate connected to the voltage rail, and the second FET having its substrate connected to the output terminal. A third FET has its respective drain and source terminals connected to the output terminal and ground, and its substrate connected to ground. A fourth FET has one of its source and drain terminals and its substrate connected to ground. A fifth FET has one of its source and drain terminals and its substrate connected to the output terminal, its gate terminal connected to the gate terminal of the fourth FET, and the other of its source and drain terminals connected to the other of the source and drain terminals of the fourth FET and to the gate terminal of the second FET. A sixth FET has one of its source and drain terminals and its substrate connected to ground and the other of its source and drain terminals connected to a junction between the first and second FETs. A seventh FET has its respective source and drain terminals connected to the voltage rail and the output terminal and it substrate connected to ground. An input terminal is connected to the gates of the fourth and fifth FETs.

BRIEF INTRODUCTION TO THE DRAWINGS

A better understanding of the invention will be obtained by reading the description of the invention below, with reference to the following drawings, in which.

DETAILED DESCRIPTION OF THE INVENTION

Figure 1:
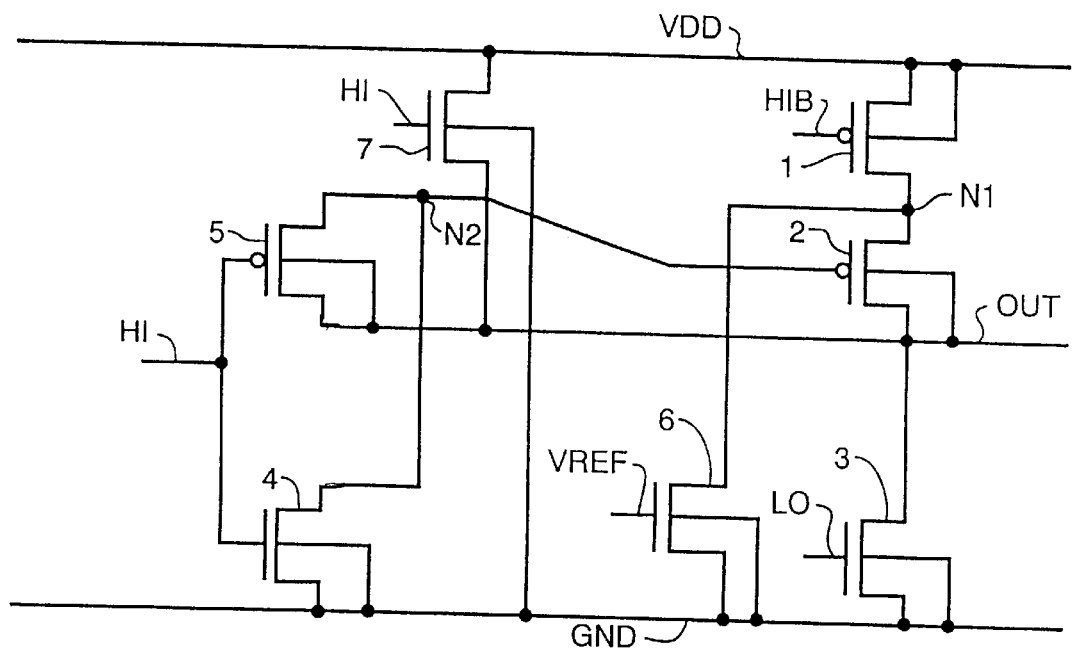
FIG. 1 is a schematic diagram of a preferred embodiment of the invention.

Referring to FIG. 1, PMOS (p-channel) and NMOS (n-channel) FETs 1 and 3 have their sources and drains connected in a series circuit between a supply rail VDD and ground. The substrate of FET 1 is connected to the supply rail and the substrate of FET 3 is connected to ground.

The source and drain of a second PMOS FET 2 is connected in the above-described circuit, between FET 1 and the output terminal OUT. The junction of FETs 1 and 2 is labeled as node N1. The substrate of FET 2 is connected to the output terminal.

An NMOS FET 4 has its source or drain and its substrate connected to ground. A PMOS FET 5 has its source or drain and its substrate connected to the output terminal. The other of the sources or drains of FETs 4 and 5 are connected together and to the gate of FET 2, and form a node labeled N2.

An NMOS FET 6 has its respective drain and source terminals connected node N1 and ground, and its substrate connected to ground.

An NMOS FET 7 has its respective source and drain terminals connected to the voltage rail VDD and the output terminal, and its substrate connected to ground.

The gates of FETs 4 and 5 are connected together with the gate of FET 7 and are labeled HI. The gate of FET 3 is labeled LO, the gate of FET 1 is labeled HIB, and the gate of FET 6 is labeled VREF. A reference voltage is applied to VREF, and various logic levels are applied to HI, LO and HIB in accordance with the following truth table, wherein OUT represents the resulting logic level at the output terminal OUT:

| HI | HIB | LO | OUT |
|----|-----|----|-----|
| 0  | 1   | 1  | 0   |
| 1  | 0   | 0  | 1   |
| 0  | 1   | 0  | HIZ |

A "1" in the table above indicates a logic high (positive logic) and a "0" indicates a logic low for the given technology. HIZ represents a high impedance state. The leads HI, HIB and LO represent inputs to the circuit.

In operation, a logic low output is accomplished by applying a logic low to the HI leads, a logic high to the HIB lead, and a logic high to the LOW lead. With the LO lead high, FET 3 turns on, pulling down the output OUT. The logic high on the HIB lead turns FET 1 off. The logic low on the HI lead turns FET 4 off, and turns FET 7 off. Thus the output lead is pulled down to low logic level.

FETs 2 and 5 do not affect this low logic level, since when FET 2 is on or off, FET 1 being off will allow FET 3 to pull the output lead to low logic level.

FET 6 should be a small FET, and with a reference voltage VREF applied to its gate, is used to pull node N1 to low logic level, so that node N1 does not float.

A high logic level output is accomplished by applying a logic high to the HI leads, a logic low to the HIB lead and a logic low to the LO lead. With the LO lead at low logic level, FET 3 is turned off. A logic high applied to the HI leads causes FET 4 to turn on, as well as FET 7, which pulls up the voltage on the output lead toward VDD until the voltage approaches one FET threshold of conduction voltage below VDD. FET 6 still pulls down node N1, minimizing the VBE voltage which appears across a parasitic PNP bipolar transistor formed by FET 2.

The low logic level on the HIB lead turns on FET 1, thus pulling up the output lead closer in voltage to VDD. As the output lead pulls high, and with the HI leads at high logic level, FET 5 turns off, isolating node N2 from the output lead.

It should be noted that since FET 5 is off, and FET 4 is on, node N2 goes to low logic level, while the output lead is at high logic level. Thus it is satisfactory to connect the substrate of FET 5 to the output lead.

It is also satisfactory to connect the substrate of FET 2 to the output lead, which normally is lower in potential than the node N1 when FET 1 is on and FET 2 is on, since the aforenoted VBE is minimized (although care should be taken in laying out the circuit in order to avoid latchup).

Thus, this circuit is capable of driving TTL voltage level circuits to high and low logic levels, with VDD of 3.3 volts, and as well allows it to work with other chips of either VDD of 3.3 volts or 5.0 volts, including CMOS and bipolar technology.

The driver circuit is put into a high impedance output state by setting the HI leads to low logic level, the HIB input lead to high logic level, and the LO lead to low logic level. Setting the LO lead to low turns FET 3 off, for any reasonable positive value of voltage on the output lead.

Setting the HI leads to logic low also causes FETs 4 and 7 to turn off. Setting the HIB lead to logic high turns FET 1 off, as long as the voltage at node N1 is less than an FET threshold of conduction voltage or diode voltage (approximately 0.5 volt) greater than VDD. In prior art drivers, if VDD is 3.3 volt, but a significantly greater voltage (e.g. 4.5 volt) is applied to the output lead, the PMOS FET equivalent to FET 1 would turn on, when it is intended to be off. However in the present invention, FETs 2 and 5 ensure that the voltage at N1 does not go high enough to turn FET 1 back on.

For voltages on the output lead OUT of between ground and VDD, the output is at high impedance, regardless of the state of FET 2, since FETs 1, 3 and 4 are definitely off. As the voltage on the output lead increases above VDD, FET 5 is on, thus allowing node N2 to track the voltage on the output lead.

In addition, FET 6 pulls down node N1, ensuring that it does not float. The substrate of FET 5 being connected to the output lead is still satisfactory in this case as well.

Since FET 2 and the output lead OUT are at a similar voltage, and the voltage on node N1 is less than the voltage on the output lead, FET 2 is off. The substrate of FET 2 to the output lead is still satisfactory in this case as well, particularly since FET 2 is never off when FET 1 is on.

The case of the HI leads being at high logic level and the LO lead being at high logic level is not a valid state, since FETs 1, 3, 4 and 7 would turn on, causing the driver to be in a high current mode.

FET 6, being used as a pull down element, is always on.

Since this driver does not have a diode connected to the VDD rail, it is desirable to design FET 3 to be able to survive electrostatic discharges, to avoid problems that could be caused by electrostatic discharges from the output lead to ground.

Figure 2:
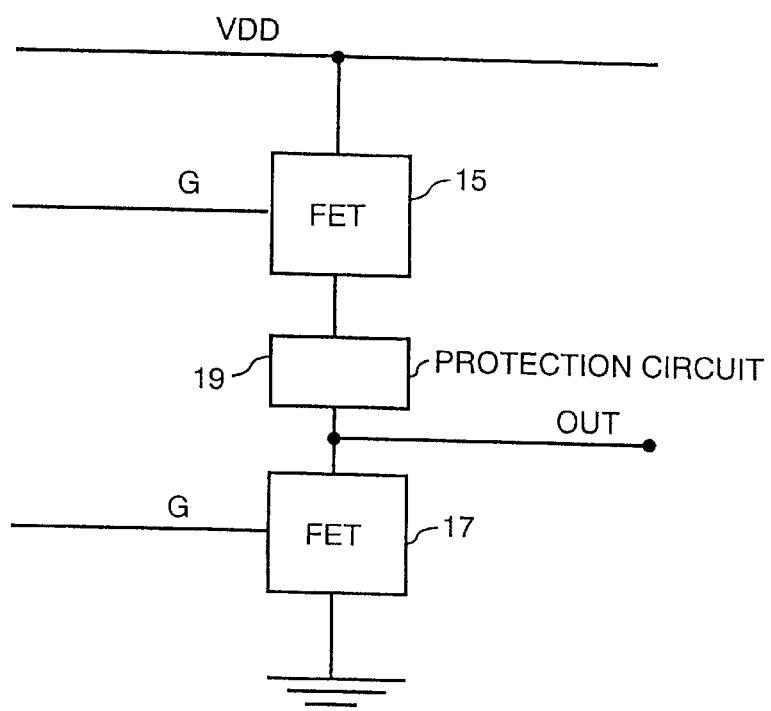
FIG. 2 is a block diagram of the invention in general form.

FIG. 2 illustrates the invention in more general form. A pair of CMOS FETs 15 and 17 have their respective sources and drains connected in a series circuit to a voltage rail VDD and ground. Similar polarity logic high and low input signals are applied to the respective gates G of the FETs, whereby either one is turned on, and thus an output terminal OUT connected in a circuit between the sources and drains of the FETs is driven toward ground and the voltage rail respectively. Opposite polarity logic high and low input signals are applied to the respective gates G of the FETs to turn them off, whereby the output terminal assumes a high impedance to ground and to the voltage rail VDD.

A protection circuit 19 maintains a voltage across the source and drain of FET 15 (which is connected in a circuit between the voltage rail and the output terminal), at less than the lower of an FET threshold of conduction voltage or diode turn-on voltage greater than the voltage of the voltage rail, during the high impedance state of the driver. It will be recognized that for an FET with spaced P+ diffusions in an n-substrate on opposite sides of an insulated gate, a parasitic P+ to n– bipolar diode is created at the junction of the P+ drain diffusion and the substrate. In the embodiment shown in FIG. 2, the protection circuit is connected between FET 15 and the output terminal OUT. The maintenance of this voltage at less than the lower of an FET threshold of conduction voltage or diode turn-on voltage greater than the voltage of the voltage rail maintains FET 15 in a high impedance state even when a voltage at the output terminal is equal to or higher than an FET threshold of conduction voltage greater than the voltage of the voltage rail (and ensures that the drain/substrate parasitic bipolar diode is not turned on). Conduction of current through the PMOS FET in the driver in the presence of high voltage on the output lead OUT during the high impedance state as in prior art drivers is thus avoided.

Of course, the invention is not limited to 3.3 volt power rails; other voltages can also be used, such as 2.9 volts or 3.6 volts. The invention also will work with circuits connected to its output terminal which is different from 5.0 volts.

A person understanding this invention may now conceive of alternative structures and embodiments or variations of the above. All of those which fall within the scope of the claims appended hereto are considered to be part of the present invention.

We claim:

1. A tri-state output driver comprising:

(a) a voltage rail, an output terminal and a ground terminal, (b) first and second PMOS FETs having source and drain terminals connected in series between the voltage rail and the output terminal, the first FET having its source and substrate connected to the voltage rail, and the second FET having its substrate connected to the output terminal, (c) a third NMOS FET having its respective source and drain terminals connected to the output terminal and ground, and its substrate connected to ground, (d) a fourth NMOS FET having one of its source and drain terminals and its substrate connected to ground, (e) a fifth PMOS FET having one of its source and drain terminals and its substrate connected to the output terminal, its gate terminal connected to the gate terminal of the fourth FET, and the other of its source and drain terminals connected to the other of the source and drain terminals of the fourth FET and to the gate terminal of the second FET, (f) a sixth NMOS FET having one of its source and drain terminals and its substrate connected to ground and the other of its source and drain terminals connected to a junction between the first and second FETs, and (g) a seventh NMOS FET having its respective source and drain terminals connected to the voltage rail and the output terminal and its substrate connected to ground.

2. A tri-state driver as defined in claim 1 further including means for receiving a reference voltage at the gate of the sixth FET, and means for receiving logic level voltages at gates of the FETs in accordance with the following truth table:

| HI | HIB | LO |
|----|-----|----|
| 0  | 1   | 1  |
| 1  | 0   | 0  |
| 0  | 1   | 0  | wherein

Hi represents the gates of the fourth, fifth and seventh FETs,

HIB represents the gate of the first FET, and

LO represents the gate of the third FET.

* * * * *